Figure 1A:
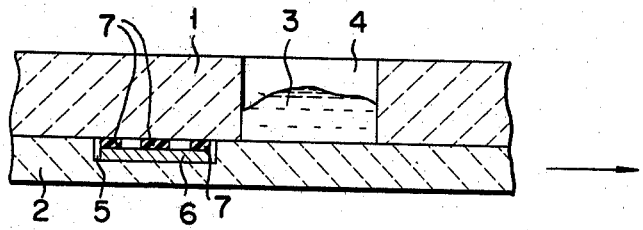

United States Patent [19]
Nakajima et al.

[11] 4,298,410
[45] Nov. 3, 1981

[54] METHOD FOR GROWING A LIQUID PHASE EPITAXIAL LAYER ON A SEMICONDUCTOR SUBSTRATE

[75] Inventors: Koichiro Nakajima, Koganei; Masaharu Watanabe, Yokosuka, both of Japan

[73] Assignee: Tokyo Shibaura Denki Kabushiki Kaisha, Japan

[21] Appl. No.: 156,593

[22] Filed: Jun. 5, 1980

[30] Foreign Application Priority Data

Jun. 6, 1979 [JP] Japan .................... 54-70145

[51] Int. Cl.³ ........................................ H01L 21/208
[52] U.S. Cl. .................. 148/172; 148/171; 29/569 L; 29/576 E
[58] Field of Search .............. 148/171, 172; 29/569 L, 29/576 E

[56] References Cited

U.S. PATENT DOCUMENTS

| | | | |
|---|---|---|---|
| Re. 28,140 | 8/1974 | Bergh et al. | 148/172 |
| 3,535,772 | 10/1970 | Knight et al. | 29/578 |
| 3,549,401 | 12/1970 | Buzko et al. | 148/171 |
| 3,647,578 | 3/1972 | Barnett et al. | 148/171 |
| 3,697,336 | 10/1972 | Lamorte | 148/171 |
| 3,715,245 | 2/1973 | Barnett et al. | 148/171 |

OTHER PUBLICATIONS

Barnett et al., IEEE Transactions on Electron Devices, vol. ED-18, No. 9, Sep. 1971, pp. 638–641.

*Primary Examiner*—G. Ozaki
*Attorney, Agent, or Firm*—Finnegan, Henderson, Farabow, Garrett and Dunner

[57] ABSTRACT

A method for selectively growing a liquid phase epitaxial layer on a semiconductor substrate comprises a first step of supplying a liquid phase epitaxial solution in a chamber of an upper body and supplying a semiconductor substrate on which is selectively coated an insulating layer in a recess in an under body, the upper surface of which constituting the bottom of said chamber; a second step of heating said semiconductor substrate and said solution to a predetermined temperature and sliding said upper body and said under body relative to each other so as to position said chamber above said recess, thereby effecting contact between said solution and said semiconductor substrate; a third step of effecting said sliding again so as to separate said recess and said chamber so that said solution remains on the regions of said semiconductor substrate surface on which said insulating layer is not coated; and a fourth step of cooling said solution and said semiconductor substrate at a constant cooling rate so as to grow a liquid phase epitaxial layer.

3 Claims, 6 Drawing Figures

U.S. Patent  Nov. 3, 1981  4,298,410

METHOD FOR GROWING A LIQUID PHASE EPITAXIAL LAYER ON A SEMICONDUCTOR SUBSTRATE

The present invention relates to a method for manufacturing semiconductor devices, in particular, light-emitting diodes based on the selective liquid phase epitaxial growth process. In selectively growing a liquid phase epitaxial layer on a semiconductor substrate based on an LPE (liquid phase epitaxy) system, a device is used which comprises an upper body with a chamber for containing a liquid solution and an under body with a recess for accommodating a semiconductor substrate on which is selectively coated an insulating layer, this under body constituting the bottom of said chamber. This device is so designed that the upper body and the under body are slidable relative to each other. In a conventional method, the epitaxial solution and the semiconductor substrate contact each other by the relative sliding movement of the upper body and the under body. The bodies are maintained at a high temperature for a certain period of time and cooled for growing an epitaxial layer. During this growing procedure, since the exposed surface of the semiconductor substrate and the insulating layer are in contact with a large amount of the epitaxial solution located thereabove, it is hard to control the thickness and width of the growing epitaxial layer.

The present invention has for its object to eliminate these problems with the conventional methods and is characterized in that the cooling process for growing the epitaxial layer is performed while only a required amount of the epitaxial solution remains on the exposed surface of the semiconductor substrate.

Figure 1B:
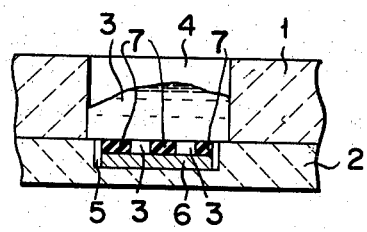
Figure 1C:
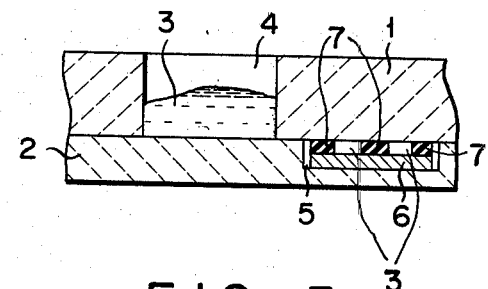
Figure 2:
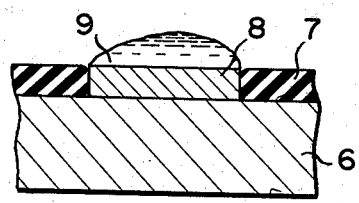
Figure 3:
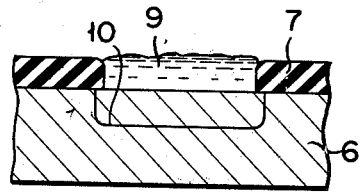
Figure 4:
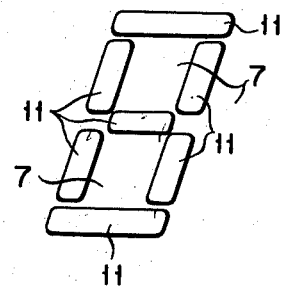

This invention can be more fully understood from the following detailed description when taken in conjunction with the accompanying drawing, in which:

FIGS. 1(A)–1(C) are sectional views illustrating a method in accordance with the present invention;

FIGS. 2 and 3 are sectional views illustrating the construction of a semiconductor region formed by a method in accordance with the present invention; and FIG. 4 is a plan view of a numerical display device manufactured by a method in accordance with the present invention.

In accordance with the present invention, an insulating layer may be a single layer made of material such as $SiO_2$, $Si_3N_4$, $Al_2O_3$ or $B_2O_3.SiO_2.Al_2O_3$ based glass; or a laminated body of such layers. Formation of the insulating layer on a semiconductor substrate may be performed by the following methods: (1) depositing $SiO_2$ on a semiconductor substrate heated to 450° C. by the reaction of $SiH_4+O_2 \rightarrow SiO_2$ in an Ar atmosphere; (2) painting a liquid compound including Si on a substrate, baking it at 200° C., and intensifying its density at 600° to 800° C.; (3) depositing $Si_3N_4$ on a substrate by the reaction of $SiH_4+NH_3 \rightarrow Si_3N_4$; (4) depositing $Al_2O_3$ by the sputtering method; and (5) electrodepositing $B_2O_3.SiO_2.Al_2O_3$ based fine glass powder on a substrate in a suspension of this fine glass powder.

For etching part of this insulating layer so as to selectively expose the surface of the substrate, a mixed acid of HF and $HNO_3$ is used when the insulating layer is made of silicon oxide; heated $H_3PO_3$ is used when the insulating layer is made of silicon nitride or aluminum oxide; and $NH_4F$ is used when the insulating layer is made of $B_2O_3.SiO_2.Al_2O_3$ based glass.

The semiconductor substrate may be made of GaP, GaAsP, GaAs, InP, GaAlAs, InGaP, GaAlAsP, Si or the like: it may be polycrystalline or of single crystal structure. The liquid phase epitaxial solution is a Ga solution with saturated As and P when the substrate is made of GaAsP; a Ga solution which includes a small amount, and less than the saturated amount, of Al and the saturated amount of As when the substrate is made of GaAlAs; a Ga solution with saturated P when the substrate is made of GaP; or a Sn solution or an Al solution when the substrate is made of Si.

Devices for performing the liquid phase epitaxy need only satisfy two requirements: that both the upper body and the under body be made of highly purified carbon to facilitate the relative sliding movement which initiates and interrupts contact between the substrate and the solution; and that the device be able to heat or cool the substrate according to a predetermined temperature program when heated in a furnace. The liquid phase epitaxial layer may be an epitaxial layer which comprises a semiconductor region grown on a single crystal semiconductor substrate, and it may be polycrystalline.

Embodiments of the present invention will be described hereinafter. As may be seen from FIG. 1(A), in the device used, both an upper body 1 and an under body 2 are made of carbon. This device comprises the upper body 1 which has a chamber 4 for containing a liquid phase epitaxial solution 3, and the under body 2 which is disposed below this upper body as a bottom for the upper body and which is slidable with respect to the upper body. The under body 2 has a recess 5 in which is disposed a semiconductor substrate 6. In FIG. 1(A), the upper body 1 and the under body 2 are so located that the epitaxial solution 3 and the semiconductor substrate 6 do not contact each other. In FIG. 1(B), the under body 2 has been slid to a point immediately below the chamber 4 of the upper body. In FIG. 1(C), the under body 2 has been further slid so that the recess 5 has passed beyond the chamber 4.

Embodiment 1

In this embodiment, a GaP substrate is used as the semiconductor substrate 6, on the surface of which is formed an $SiO_2$ layer by the CVD method. This $SiO_2$ layer has openings which are formed by forming a photoresist over the $SiO_2$ layer and subsequently dissolving the exposed regions in a mixed acid of HF and $HNO_3$. This layer serves as an insulating layer 7.

The openings of this insulating layer are circles each 1 mm in diameter. A number of them are distributed in a grid form. The epitaxial solution is a Ga solution which includes Zn and O supplied from Zn metal and $Ga_2O_3$, and which includes a saturated amount of P.

The arrangement as shown in FIG. 1(A) is maintained for 10 minutes at 1,000° C. Then the under body 2 is slid at this temperature to a position as shown in FIG. 1(B). After an interval of 10–20 minutes, the under body 2 is further slid to a position as shown in FIG. 1(C), and cooling is performed to 800° C. at a cooling rate of 2° C. per minute. As a result, a GaP epitaxial layer 8 of about $2\mu$ in thickness with added Zn and O is formed in the openings of the insulating layer 7 on the substrate as shown in FIG. 2. Extra solution 9 is swept away.

Embodiment 2

In this embodiment, the epitaxial solution is a highly purified Ga solution. The device is heated from 30° C.

to 1,000° C. under the condition shown in FIG. 1(C). After an interval of 20 minutes at this temperature, it is cooled to 800° C. at a cooling rate of 2° C. per minute to obtain a semiconductor element as shown in FIG. 3.

A regrowth region 10 is formed inside the GaP substrate below the openings of the insulating layer 7. The extra Ga solution 9 is swept away.

Embodiment 3

A p-type liquid phase epitaxial region is recrystallized on an n-type GaP single crystal substrate manufactured by the pulling method in a construction as shown in FIG. 3 by the method of Embodiment 2. The epitaxial solution used is a Ga solution with added Zn and O. The p-n junction formed in the substrate is used as a red color light-emitting diode.

This diode has a light-emitting efficiency of about 4% and an electric current density of 5 mA/mm$^2$. This is almost double the value for conventional products since they only present about 2% light-emitting efficiency. Further, in the conventional methods, 8 g of Ga is ordinarily consumed per 20 cm$^2$ of wafer. In this embodiment, only about 3 g of Ga is consumed, resulting in economical manufacture.

Embodiment 4

In this embodiment, a numerical display device is manufactured in a manner similar to that in Embodiment 3, and is shown in the plan view of FIG. 4. In FIG. 4, a numerical display region 11 comprises a recrystallized p-type layer, the surrounding region comprises an insulating layer, e.g., an oxide layer 7, and an n-type region of a substrate (not shown) is disposed thereunder.

Embodiment 5

The epitaxial solution and the semiconductor substrate as in Embodiment 1 are used. The device is heated to 1,000° C. for 10 minutes. After an interval of 10 minutes under the condition as shown in FIG. 1(B), it is heated to 1,050° C. at a rate of 2° C. per minute under the condition shown in FIG. 1(C). It is then cooled to 800° C. at a cooling rate of 2° C./min. A p-n junction is formed in the substrate as a result.

What we claim is:

1. A method for selectively growing a liquid phase epitaxial layer based on a liquid phase epitaxy, comprising the steps of
arranging a liquid phase epitaxial solution apart from a semiconductor substrate having an insulating layer selectively formed on the surface,
heating the substrate and the epitaxial solution to a predetermined temperature and, then, bringing them into mutual contact,
selectively removing the solution such that the solution remains on the exposed surface of the substrate, with the insulating layer bearing substantially no solution, and
cooling the substrate and the solution at a predetermined cooling rate so as to grow a liquid phase epitaxial layer on the exposed surface of the substrate.

2. A method for selectively growing a liquid phase epitaxial layer based on a liquid phase epitaxy, comprising the steps of
arranging a liquid phase epitaxial solution apart from a semiconductor substrate having an insulating layer selectively formed on the surface,
bringing the substrate and the epitaxial solution into mutual contact,
selectively removing the solution such that the solution remains on the exposed surface of the substrate, with the insulating layer bearing substantially no solution,
heating the substrate and the solution to a predetermined temperature, and
cooling the substrate and the solution at a predetermined cooling rate so as to grow a liquid phase epitaxial layer below the exposed surface of the substrate.

3. A method of selectively growing a liquid phase epitaxial layer based on a liquid phase epitaxy, comprising the steps of
arranging a liquid phase epitaxial solution apart from a semiconductor substrate having an insulating layer selectively formed on the surface,
heating the substrate and the epitaxial solution to a predetermined temperature and, then, bringing them into mutual contact,
selectively removing the solution such that the solution remains on the exposed surface of the substrate, with the insulating layer bearing substantially no solution,
heating the substrate and the solution further to a predetermined temperature, and
cooling the substrate and the solution at a predetermined cooling rate so as to grow a liquid phase epitaxial layer both above and below the exposed surface of the substrate.

* * * * *